United States Patent [19]
Hackenberg

[11] Patent Number: 5,830,279
[45] Date of Patent: Nov. 3, 1998

[54] DEVICE AND METHOD FOR IMPROVING CORROSION RESISTANCE AND ETCH TOOL INTEGRITY IN DRY METAL ETCHING

[75] Inventor: John J. Hackenberg, Palm Bay, Fla.

[73] Assignee: Harris Corporation, Melbourne, Fla.

[21] Appl. No.: 536,257

[22] Filed: Sep. 29, 1995

[51] Int. Cl.[6] ................................. B08B 6/00; B44C 1/22
[52] U.S. Cl. ................................. 134/1.1; 216/49; 134/1.2
[58] Field of Search ............................ 156/345, 659.11, 156/643.1; 216/67, 69, 49; 134/1.1, 1.2

[56] References Cited

U.S. PATENT DOCUMENTS

| 4,379,832 | 4/1983 | Dalal et al. | 430/315 |
| 5,417,826 | 5/1995 | Blalock | 204/176 |

FOREIGN PATENT DOCUMENTS

| 63-260132 | 10/1988 | Japan . |
| 01055827 | 3/1989 | Japan . |
| 01189122 | 7/1989 | Japan . |
| 04002123 | 1/1992 | Japan . |
| WO/222084 | 12/1992 | WIPO . |

*Primary Examiner*—R. Bruce Breneman
*Assistant Examiner*—George Goudreau
*Attorney, Agent, or Firm*—Rogers & Killeen

[57] ABSTRACT

A device and method for removing contaminants from semiconductor wafers and from the interior of wafer processing chambers in which the temperature inside the chambers is raised to sufficiently high levels for short time periods. In a wafer etching chamber, heat cleaning is performed after wafer removal and lessens the required frequency of other cleaning methods and in doing so reduces the time the chamber is unavailable. In a mask removal chamber, heat cleaning is performed with the wafer in the chamber and while still under vacuum conditions, thereby driving contaminants off of both the wafer and the chamber interior. The wafer cleaning is performed prior to exposure to atmospheric water vapor which can initiate corrosion.

12 Claims, 1 Drawing Sheet

DEVICE AND METHOD FOR IMPROVING CORROSION RESISTANCE AND ETCH TOOL INTEGRITY IN DRY METAL ETCHING

BACKGROUND OF THE INVENTION

The present invention is related to semiconductor manufacturing processes, and more particularly to a device and method for removing contaminants from semiconductor wafers and from the interior walls of the chambers in which they are made.

It is known in the field of semiconductor manufacture to use particular single-wafer chambers to etch wafers and to use other single-wafer chambers to remove the masks. The gas compounds used in the etching chambers to dry etch metals used in integrated circuit (IC) fabrication typically comprise halogens or halogen containing compounds. Chlorine and boron trichloride are the two most commonly used etch gases. Hydrogen bromide, bromine, iodine, and methyl chloride may also be used for dry metal etching. These gases and some of the etch by-products deposit contaminants on the interior of the etching chamber. The polymer and resist build-up from the masks deposit contaminants in the mask removal chamber.

The etch gases and their by-products may also initiate corrosion of the chamber walls and of the semiconductor wafers in the chamber. The corrosion may be initiated by the halogens (etch gases, etch by-products) that are absorbed on the photoresist, on the substrate or in the sidewall passivant. The etch by-products, typically aluminum chloride, react with moisture to form hydrogen chloride, which in turn reacts with the metal to form more aluminum chloride which can repeat the cycle.

Both of these chambers must be cleaned periodically, leaving the chambers unavailable for production work and requiring re-qualification of the chambers after cleaning. By way of example, the etch chamber is periodically dry cleaned by introducing a non-aluminum etching plasma into the chamber for a finite period of time. The total down time associated with this process is usually about one hour. Under typical conditions, a single-wafer etching chamber is dry cleaned every 25 to 50 wafers.

The etching chamber must also be wet cleaned, though less frequently, by disassembling the chamber and cleaning the components using water or a solvent. The wet cleaning process and the subsequent recalibration of the chamber takes from four to five hours. For a single-wafer etching chamber, wet cleaning is normally performed approximately once every 1500 wafers if intermediate dry cleanings are not performed or once every 4000 wafers if they are.

To reduce the amount of corrosion caused by single wafer dry metal etching, it is known to strip the resist in the mask removal chamber (rather than in the etching chamber), and/or to passivate the wafer surface with a fluorocarbon plasma, or water rinse which may include a water vapor flow under a vacuum.

Accordingly, it is an object of the present invention to provide a novel device and method for cleaning a semiconductor wafer manufacturing chamber and/or the wafer therein which requires less time than the prior art, thereby obviating the problems of the prior art.

It is another object of the present invention to provide a novel device and method for increasing overall throughput of a semiconductor manufacturing process by reducing chamber down time.

It is yet another object of the present invention to provide a novel device and method for simultaneously cleaning the interior of a mask removal chamber and the wafer contained therein through elevated temperature and reduced atmospheric pressure.

It is still another object of the present invention to provide a novel single-wafer manufacturing chamber capable of cleaning itself between wafers by elevating the interior temperature to a prescribed temperature for a short period of time.

These and many other objects and advantages of the present invention will be readily apparent to one skilled in the art to which the invention pertains from a perusal of the claims and the following detailed description of the preferred embodiments.

DESCRIPTION OF PREFERRED EMBODIMENTS

In an embodiment of the present invention, a semiconductor etching chamber is heated to high temperatures for a brief period of time after the wafer is removed. The elevated temperature and its duration are sufficient to desorb much of the accumulated contaminants from the chamber interior (remove them from the surfaces by changing them from a solid to a gas). This occasional heat cleaning reduces the frequency of required cleanings by the wet and dry cleaning methods, thereby reducing the overall down time of the chamber.

Figure 1:
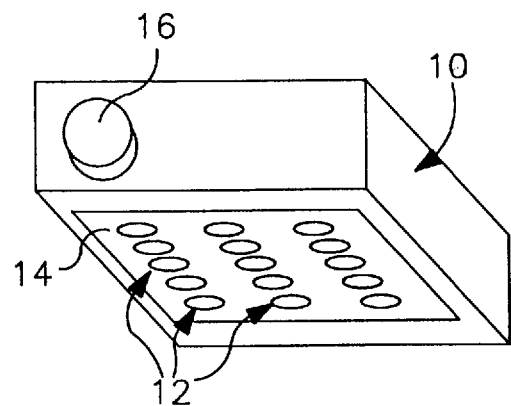
FIG. 1 is pictorial representation of an embodiment of the etching chamber of the present invention.

By way of further explanation, and with reference to etching chamber 10 in FIG. 1, the temperature of the (empty) etching chamber interior may be raised to approximately 250° to 350° C. for about three to seven minutes, preferably about 300° C. for about five minutes, at a pressure of from about 1 millitorr to about 4 torr to volatilize the contaminants. The time and temperature may be varied to suit a particular chamber. For example, a higher temperature may be used for a shorted period of time, and vice versa. The minimum acceptable temperature is above about 100° C. which ensures that the vapor pressure is high enough to facilitate volatilization of the contaminants. The maximum acceptable temperature will likely be a function of the temperature limit of the chamber seals and the time needed to cool the chamber down to its normal operating temperature of about 85° C. (the cooling period being a period when the chamber is unavailable for production.) While the temperature is elevated, an inert gas may be moved through the chamber to improve temperature uniformity and maintain the flow of the volatilized contaminants to improve vacuum flush.

Infrared lamps 12, such as quartz halogen lamps or mercury lamps, or electric resistive elements (not shown) may be used to heat the etching chamber, although the use of resistive elements may increase time needed to heat and for cooling of the chamber. Lamps 12 are desirably arranged so that the walls of the chamber are heated quickly to avoid production delays. The lamps may be outside the chamber and directed into the chamber through a window 14 (e.g., of quartz) and are desirably as close to the window as feasible. An arrangement suitable for a single-wafer etching chamber may include ten to fifteen lamps 12 of about 500 to 1000 watts each. Window 14 and lamps 12 may be on any side of the chamber, though they are preferably on the top or bottom depending on the arrangement of chamber 10. After heating, the volatilized contaminants and the inert gas used for flushing the contaminants may be removed with a vacuum pump 16.

Etching chamber 10 may be heat cleaned as set forth herein after several lots of wafers (for example, one to two lots), with about 15 to 30 wafers per lot. The heat cleaning may be accomplished automatically as part of an automated wafer etching process.

Figure 2:
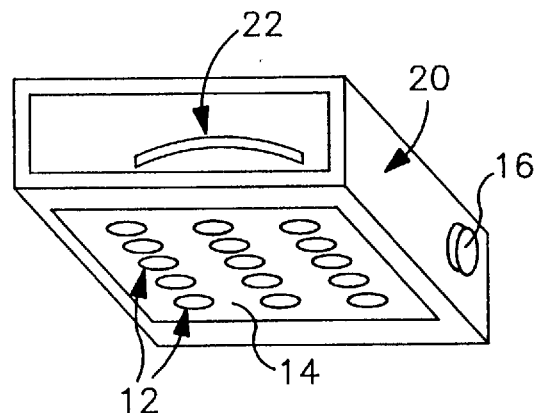
FIG. 2 is pictorial representation of an embodiment of the mask removal chamber of the present invention.

In a further embodiment, and with reference now to FIG. 2, a single-wafer mask removal chamber 20 may be rapidly heated when wafer 22 is inside chamber 20, before or after mask removal, and under reduced atmospheric pressure. The rapid heating volatilizes contaminants on wafer 22 and on the interior of chamber 20. The reduced atmospheric pressure inside the chamber results in a lower temperature requirement and prevents undesired interaction between etch byproducts and atmospheric water vapor which produces contamination.

Heating of the interior of mask removal chamber 20 may be accomplished in the manner described above, such as with lamps 12 projected through window 14. The placement of lamps 12 in chamber 20 will vary, although they are preferably directed up towards the underside of wafer 22. As with etching chamber 10, an inert gas may be moved through mask removal chamber 20 during heat cleaning to facilitate temperature uniformity and to facilitate flushing of the volatilized contaminants by vacuum pump 16 at the end of the cleaning. In contrast to etching chamber 10, mask removal chamber 20 need not be cooled before the next wafer can be processed. The mask may be removed at the elevated temperature required for cleaning.

In operation, the atmospheric pressure in the chamber is desirably reduced to approximately one millitorr to 4 torr and the temperature inside the chamber is raised to such a level and for such a time so that both wafer contaminants and chamber deposits are volatilized after etchant removal. For example, for a photoresist mask the appropriate time and temperature are about two to three minutes at approximately 175° C. For a non-photoresist mask, the appropriate values would be about one to two minutes at approximately 350° to 400° C. These values may vary as appropriate for particular chambers and wafers, with shorter times being used if the temperature is increased.

The heat cleaning in the mask removal chamber may be performed before or after mask removal, although the advantage of a cleaner and easier mask removal can be realized if the heat cleaning is accomplished before mask removal. If the heating is performed after mask removal, the time and temperature for the photoresist mask would match those for the non-photoresist mask stated above.

As with chamber 10, the upper limit for the heating temperature will likely be set by the integrity limits of the chamber seals. If the type of seals used in a chamber cannot be subjected to the temperatures discussed herein, the temperature may be reduced and the time commensurately increased. The minimum heating temperature will also be approximately 100° C., below which the vapor pressure of the contaminants is too low to facilitate volatilization.

As will be appreciated, chambers 10 and 14 need not be single purpose chambers, and may be used sequentially for etching, mask removal, and other functions.

The method of manufacturing semiconductor wafers herein reduces the overall average downtime of the chamber per wafer. For example, when the etching chamber is heat cleaned after each lot, the dry cleanings may be about one-fourth to one-half as frequent as without the heat cleaning, and the wet cleanings may also be about one-fourth to one-half as frequent. As will be appreciated by those of skill in the art, the cumulative cleaning time will be reduced, thereby improving manufacturing productivity.

By way of further explanation, if the chamber is off line for a time T for cleaning and requalification after the manufacture of N wafers, the chamber will be unavailable for the manufacture of wafers an average of T/N minutes per wafer. If, in accordance with the present invention, the temperature of the chamber is elevated for a time T' after each lot of wafers, where T' is much less than T, so that the number of wafers between cleaning and requalification is increased to 4 times N, the average downtime per wafer will be (T+T→ )/4N which will be much smaller than the previous average downtime per wafer of T/N, if T' is small relative to T, as it is herein. For the exemplary times and numbers provided herein, the average downtime per wafer may be reduced by a factor three or more.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A method of removing contaminants from interior surfaces of a single-wafer chamber for manufacturing semiconductor wafers, the method comprising the steps of providing heating lamps which face into the interior of the chamber, and elevating the temperature of the interior surfaces with the heating lamps to a sufficiently high temperature for a sufficient period of time after a predetermined number of wafers have been manufactured in the chamber to volatilize the contaminants on the interior surfaces and thereby remove contaminants from the interior surfaces of the chamber.

2. The method of claim 1 wherein the chamber is for etching the wafer, and wherein the step of elevating the temperature comprises the steps of heating the interior surfaces to about 250° to 350° C. for about three to seven minutes.

3. The method of claim 1 wherein the chamber is for photoresist mask removal, and wherein the step of elevating the temperature comprises the steps of heating the interior surfaces to about 175° C. for about two to three minutes.

4. The method of claim 3 further comprising the step of setting the pressure inside the chamber to about one millitorr to four torr.

5. The method of claim 1 wherein the chamber is for non-photoresist mask removal, and wherein the step of periodically elevating the temperature comprises the steps of heating the interior surfaces to about 350° to 400° C. for about one to two minutes.

6. The method of claim 5 further comprising the step of setting the pressure inside the chamber to about one millitorr to four torr.

7. The method of claim 1 wherein the step of providing heating lamps comprises the steps of situating the heating lamps outside the chamber and directing them through a window in the chamber.

8. The method of claim 1 wherein the step of elevating the temperature is carried out after every one to two lots of wafers, with approximately 15 to 30 wafers per lot.

9. A method of decreasing the total down time of an etching chamber for cleaning by periodically elevating the temperature of the chamber to a temperature, and for a time, sufficient to volatilize contaminants on the internal chamber walls in the presence of an inert gas and outgassing the volatilized contaminants between conventional wet and dry cleanings of the chamber.

10. The method of claim 9 wherein the temperature is raised to 250° to 350° C. for between 3 and 5 minutes at a pressure between about $10^{-3}$ and 4 Torr.

11. The method of claim 4 wherein the steps of elevating the temperature and setting the pressure can occur prior to or following the mask removal of a semiconductor wafer.

12. The method of claim 11 wherein the steps of elevating the temperature and setting the pressure can occur while the wafer is in the chamber, thereby removing contaminants from the wafer as well as from the chamber.

* * * * *